(12) United States Patent
Fukami

(10) Patent No.: US 9,535,108 B2
(45) Date of Patent: Jan. 3, 2017

(54) INSPECTION APPARATUS AND INSPECTION METHOD

(71) Applicant: Kabushiki Kaisha Nihon Micronics, Tokyo (JP)

(72) Inventor: Yoshiyuki Fukami, Ibaraki (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 43 days.

(21) Appl. No.: 14/505,632

(22) Filed: Oct. 3, 2014

(65) Prior Publication Data

US 2015/0108997 A1 Apr. 23, 2015

(30) Foreign Application Priority Data

Oct. 18, 2013 (JP) .................................. 2013-217515

(51) Int. Cl.
 G01R 31/28 (2006.01)
 G01R 31/04 (2006.01)
 (Continued)

(52) U.S. Cl.
 CPC ......... G01R 31/041 (2013.01); G01R 31/2805 (2013.01); G01R 31/2812 (2013.01); H05K 1/0268 (2013.01); *G01R 31/026* (2013.01); *H05K 1/0306* (2013.01); *H05K 1/117* (2013.01); *H05K 3/4605* (2013.01); *H05K 2201/09845* (2013.01)

(58) Field of Classification Search
 CPC . G01R 31/2853; G01R 1/0408; G01R 1/0491; G01R 31/2893; G01R 31/2863; G01R 31/003; G01R 31/2867; H05K 1/0268; H05K 1/0306; H05K 1/117; H05K 3/4605; H05K 2201/09845

USPC ............................................. 324/538, 762.03
See application file for complete search history.

(56) References Cited

U.S. PATENT DOCUMENTS 5,006,808 A * 4/1991 Watts ................. G01R 31/2805
 324/537
6,084,295 A * 7/2000 Horiuchi ............. H01L 23/3121
 257/690
(Continued)

FOREIGN PATENT DOCUMENTS

JP 53-10863 A * 1/1978 ............. H05K 13/08
JP 2008-218443 A 9/2008
(Continued)

OTHER PUBLICATIONS

Korean Patent Office; Office Action in corresponding Korean Patent Application No. 10-2014-0086887 (May 15, 2015).

*Primary Examiner* — Melissa Koval
*Assistant Examiner* — Rahul Maini
(74) *Attorney, Agent, or Firm* — Leydig, Voit & Mayer, Ltd.

(57) ABSTRACT

An inspection apparatus for inspecting an inspection object. The inspection object includes a base body and wiring passing through the base body. The inspection apparatus includes an insulating substrate, a first electrode in the substrate with a portion of the first electrode exposed from a surface of the substrate to form a connection portion which may be electrically connected with the wiring, and a second electrode in the substrate. The first electrode and the second electrode are spaced apart, have mutually parallel portions, and are electrically insulated from each other.

7 Claims, 11 Drawing Sheets

(51) Int. Cl.
*G01R 27/26* (2006.01)
*H05K 1/02* (2006.01)
H05K 1/03 (2006.01)
H05K 1/11 (2006.01)
H05K 3/46 (2006.01)
G01R 31/02 (2006.01)

(56) References Cited

U.S. PATENT DOCUMENTS

| | | | |
|---|---|---|---|
| 7,489,147 B2 | 2/2009 | Kimura et al. | |
| 7,659,727 B2 * | 2/2010 | Fukami | G01R 31/2805 324/537 |
| 8,344,749 B2 * | 1/2013 | Stillman | G01R 31/2886 324/762.02 |
| 2009/0101402 A1 * | 4/2009 | Seki | H05K 1/0222 174/262 |
| 2009/0153146 A1 * | 6/2009 | Kimura | G01R 1/07335 324/537 |

FOREIGN PATENT DOCUMENTS

| KR | 10-2007-0033469 A | 3/2007 |
|---|---|---|
| KR | 10-2007-0045099 A | 5/2007 |

* cited by examiner

INSPECTION APPARATUS AND INSPECTION METHOD

CROSS-REFERENCE TO RELATED APPLICATION

The entire disclosure of the Japanese Patent Application No. 2013-217515, filed on Oct. 18, 2013, including specification, claims, drawings, and summary, on which the Convention priority of the present application is based, is incorporated herein in their entirety.

BACKGROUND OF THE INVENTION

The present invention relates to an inspection apparatus and an inspection method.

In an inspection method for inspecting a wiring substrate configured by arranging wiring on a substrate, there is a method to perform a test by a so-called continuity check, that is, by supplying a current through a test probe or the like to positions where wiring is disposed and determining whether the current is received from other positions.

However, in the inspection method by the continuity check, in a case where a wiring substrate includes a plurality of independent wiring patterns and a short circuit is detected therebetween, it is necessary to fix one end of the probe to one arbitrary wiring pattern and electrically connect the other end of the probe to all other wiring. Furthermore, such an operation needs to be performed on all independent wiring patterns, and the inspection method is very complicated.

Therefore, in the inspection of the wiring substrate, an inspection method has been reviewed which inspects a continuity or the like of a wiring by measuring an electric capacitance between a wiring and an electrode such as a ground (GND) and comparing a magnitude of the obtained electric capacitance with an expected value (see, for example, Japanese patent publications S53-10863 and 2008-218443).

However, in the related art inspection method for inspecting the wiring substrate by measuring the electric capacitance, in a case where the electric capacitance between the wiring and the electrode such as GND is very small, even when a wiring is disconnected in the middle, it is difficult to detect the disconnection.

For example, recently, a through wiring substrate technology, such as a Through Silicon Via (TSV) technology or a Through Glass Via (TGV) technology, has attracted attention in the fields of wiring substrates.

For example, the TSV technology is one of semiconductor packaging technologies and uses a through silicon via (TSV) that vertically passes through the inside of a semiconductor chip made of silicon or the like. Similarly, the TGV technology uses a through glass via (TGV).

In the past, in a case where a plurality of semiconductor chips is overlapped and accommodated in one package, electrical connection between the stacked semiconductor chips is achieved by using a wire bonding technology. In contrast, for example, the TSV technology performs electrical connection between the stacked semiconductor chips by a TSV. The use of the TSV technology can eliminate the necessity of a wiring space for wire bonding. Therefore, in a case where the TSV technology is used, a semiconductor package with three-dimensionally mounted chips can be made smaller and thinner as compared with the related art.

In the semiconductor packaging technology using such TSV technology, it is important that a TSV vertically passing through a semiconductor chip being a base body is formed to have a desired characteristic. Therefore, in the semiconductor chip or the like in which the TSV is formed, an inspection for detecting the existence or non-existence of disconnection of the TSV is required.

In a silicon chip with a TSV, the TSV can be regarded as a plurality of mutually independent wiring. The silicon chip in which the TSV is formed can be regarded as a wiring substrate including a plurality of mutually independent wiring. Therefore, in the inspection in which the silicon chip with the TSV is an inspection object, as described above, it is desirable to apply the inspection method for inspecting the wiring substrate by measuring the electric capacitance.

However, in the case of the silicon chip with the TSV, since the substrate being the base body is thin and a conductive material such as a metal for configuring the TSV is little, the electric capacitance formed between the TSV and other electrode is small. Therefore, in the inspection by the measurement of the electric capacitance, even when the TSV being the wiring is disconnected in the middle, it is difficult to detect the disconnection.

Therefore, there is a need for a technology that can inspect a disconnection or the like of a wiring by measuring an electric capacitance of an inspection object such as a silicon chip with a TSV. That is, for an inspection object including a base body made of silicon or glass and a wiring passing through the base body, there is a need for a technology that can inspect the disconnection or the like of the wiring by measuring the electric capacitance even in the case where, since the base body is small, the wiring passing through the base body is also small and the electric capacitance of the wiring to be inspected is small.

The present invention has been contrived in consideration of such problems.

That is, the purpose of the present invention is to provide an inspection apparatus that can inspect an inspection object by measuring an electric capacitance even in a case where an electric capacitance of a wiring of the inspection object is small.

Further, the purpose of the present invention is to provide an inspection method that can inspect an inspection object by measuring an electric capacitance even in a case where an electric capacitance of a wiring of the inspection object is small.

The other objects and advantages of the present invention become clear in the following description.

SUMMARY OF THE INVENTION

According to one aspect of the present invention, an inspection apparatus for inspecting an inspection object wherein the inspection object includes a base body and a wiring passing through the base body, the inspection apparatus comprising, a substrate made of an insulating material, a first electrode provided in the substrate such that a portion of the first electrode is exposed from a surface of the substrate to form a connection portion which is electrically connected with the wiring, and a second electrode provided in the substrate, wherein the first electrode and the second electrode are spaced and arranged to have mutually parallel portions and are electrically insulated from each other.

Further to this aspect of the present invention, an inspection apparatus, wherein the first electrode is provided in the substrate to extend in a direction perpendicular to the surface of the substrate in which the connection portion is formed.

Further to this aspect of the present invention, an inspection apparatus, wherein the inspection object includes a plurality of wiring passing through the base body, the first electrode is provided with a plurality of first electrodes that are electrically insulated from one another to form a pair with the single connection portion of each of ends of the plurality of wiring of the inspection object, the second electrode is provided with a plurality of second electrodes that are mutually electrically connected to one another, and the first electrode has a portion mutually parallel to the second electrode nearest to the first electrode.

Further to this aspect of the present invention, an inspection apparatus, wherein the plurality of second electrodes is arranged to include a structure in which at least one pair of the second electrodes holds the single first electrode.

According to another aspect of the present invention, an inspection apparatus for inspecting an inspection object wherein the inspection object includes a base body and a wiring passing through the base body, the inspection apparatus comprising, a substrate made of a conductive material, a recessed portion provided in the substrate, an insulating member that covers a wall surface of the recessed portion, and an electrode which is inserted into the recessed portion to cover a surrounding with the insulating member and of which a portion is exposed from a surface of the substrate to form a connection portion which is electrically connected with the wiring, wherein the wall surface of the recessed portion and the electrode have mutually parallel portions and are spaced apart from each other by the insulating member to be electrically insulated from each other.

Further to this aspect of the present invention, an inspection apparatus, wherein the electrode is provided to extend in a direction perpendicular to the surface of the substrate in which the connection portion is formed.

Further to this aspect of the present invention, an inspection apparatus, wherein in the wall surface of the recessed portion and the electrode, a distance between the mutually parallel portions is smaller than a distance between other portions.

Further to this aspect of the present invention, an inspection apparatus, wherein the inspection object includes a plurality of wiring passing through the base body, and the recessed portion and the electrode are provided with a plurality of recessed portions and a plurality of electrodes such that each of ends of the plurality of wiring forms a pair with the single connection portion.

According to another aspect of the present invention, an inspection method for inspecting an inspection object including a base body and a plurality of wiring passing through the base body by using an inspection apparatus including, a substrate made of an insulating material, a first electrode provided in the substrate such that a portion of the first electrode is exposed from a surface of the substrate to form an electrical connection portion, and a second electrode provided in the substrate, wherein the first electrode is provided with a plurality of first electrodes to form a pair with the single connection portion of each of ends of the plurality of wiring, the plurality of first electrode being arranged to be electrically insulated from one another, the second electrode are provided with a plurality of second electrodes that are mutually electrically connected to one another, and the first electrode and the second electrode have portions parallel to the second electrode nearest to the first electrode, and are spaced apart from each other to be electrically insulated from each other, the method comprising, a connecting operation of electrically connecting each of one ends of the plurality of wiring of the inspection object to the connection portion of the first electrode of the inspection apparatus, which forms a pair therewith, and an electric capacitance measuring operation of sequentially selecting the plurality of wiring of the inspection object one by one and measuring an electric capacitance between the other end of the selected single wiring and the plurality of second electrodes connected to one another.

According to another aspect of the present invention, an inspection method for inspecting an inspection object including a base body and a plurality of wiring passing through the base body by using an inspection apparatus including, a substrate made of a conductive material, a recessed portion provided in the substrate, an insulating member that covers a wall surface of the recessed portion, and an electrode which is inserted into the recessed portion to cover a surrounding with the insulating member and of which a portion is exposed from a surface of the substrate to form an electrical connection portion, wherein the recessed portion and the electrode are spaced apart from each other by the insulating member such that the wall surface of the recessed portion and the electrode have mutually parallel portions, and are electrically insulated from each other, and the recessed portion and the electrode are provided with a plurality of recessed portions and a plurality of electrodes such that each of ends of the plurality of wiring forms a pair with the single connection portion of the electrode, the method comprising, a connecting operation of electrically connecting each of one ends of the plurality of wiring of the inspection object to the connection portion of the electrode of the inspection apparatus, which forms a pair therewith, and an electric capacitance measuring operation of sequentially selecting the plurality of wiring of the inspection object one by one and measuring an electric capacitance between the other end of the selected single wiring and the substrate.

DESCRIPTION OF THE EMBODIMENTS

The present invention relates to an inspection apparatus for inspecting an inspection object with a wiring by measuring an electric capacitance, and an inspection method for inspecting an inspection object by measuring an electric capacitance by using the inspection apparatus.

In the present invention, the inspection object may include a base body and a wiring passing through the base body. For example, the inspection object may be a semiconductor chip or a semiconductor substrate including a TSV as a through electrode passing through a base body such as a silicon substrate, or may be a glass substrate including a TGV as a through electrode.

The inspection apparatus of the present invention is configured to include a substrate made of an insulating material and an electrode and can apparently increase an electric capacitance of a wiring of an inspection object by connecting the wiring of the inspection object to the electrode of the inspection apparatus. In the present invention, even in a case where the electric capacitance of the wiring included in the inspection object is small, the inspection object can be inspected easily and rapidly by increasing the apparent electric capacitance and measuring the electric capacitance.

The inspection apparatus and inspection method according to the present embodiment will be described accordingly using the drawings below.

Embodiment 1

Figure 1:
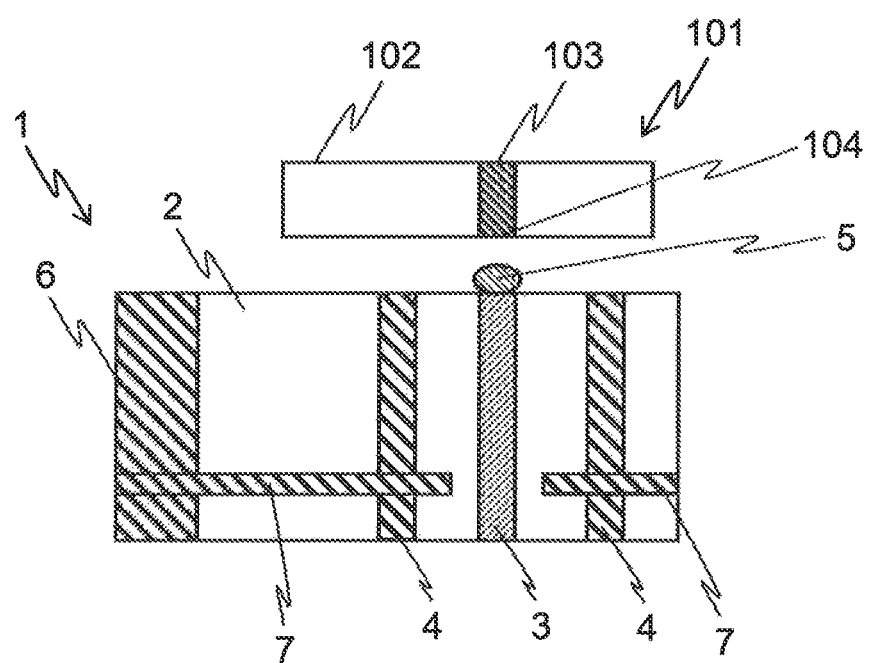
FIG. 1 shows a configuration of an inspection apparatus according to the first embodiment of the present invention.

FIG. 1 shows a configuration of an inspection apparatus according to the first embodiment of the present invention.

As illustrated in FIG. 1, an inspection apparatus 1 of a first embodiment of the present invention is an inspection apparatus that is combined with a wiring substrate 101 being an inspection object and is used to inspect the wiring substrates 101. The wiring substrate 101 includes a base body 102 and a wiring 103 passing through the base body 102. In the wiring 103 of the wiring substrate 101, an end portion of the inspection apparatus 1 side being an end portion of one side configures a terminal 104.

The wiring substrate 101 may include the base body 102 such as, for example, a silicon substrate, and the wiring 103 passing through the base body 102, or may be a semiconductor chip or semiconductor substrate with a TSV.

The inspection apparatus 1 of the first embodiment of the present invention includes a substrate 2, an electric capacitance electrode 3 being a first electrode, and a common electrode 4 being a second electrode.

The substrate 2 is an electrically insulating substrate made of an insulating material. As a material configuring the substrate 2, a material configuring a base substrate of a well-known printed wiring substrate may be used, and a resin such as polyimide or a material such as a ceramic may be used. The substrate 2 need not be rigid and may be configured using a flexible insulating material such as a rubber.

The electric capacitance electrode 3 is provided in the substrate 2 such that an end portion being a portion of the electric capacitance electrode 3 is exposed from a surface of the substrate 2 of a side where the wiring substrate 101 is disposed, and thus configures an electrical connection portion. That is, as illustrated in FIG. 1, in the inspection apparatus 1, an electrode pad 5 is provided in an end portion of the electric capacitance electrode 3 which is exposed from the surface of the substrate 2, and the electrical connection portion of the electric capacitance electrode 3 is configured.

The inspection apparatus 1 of the first embodiment of the present invention may be configured without the electrode pad 5, and may configure the electrical connection portion without the electrode pad 5 by protruding the end portion of the electric capacitance electrode 3 from the surface of the substrate.

The electric capacitance electrode 3 is made of a conductive material and has a rod shape, but may also have a line shape or a plate shape. The electric capacitance electrode 3 may be made of, for example, a metal such as copper, aluminum, silver, and gold.

In the inspection apparatus 1 of the first embodiment of the present invention, it is desirable that the electric capacitance electrode 3 is provided in the substrate 2 to extend in a direction perpendicular to the surface of the substrate 2 of the wiring substrate 101 side in which the connection portion is configured.

Further, the common electrode 4 is provided in the substrate 2. The common electrode 4 is made of a conductive material and has a rod shape, but may also have a line shape or a plate shape. Similar to the electric capacitance electrode 3, the common electrode 4 may be made of, for example, a metal such as copper, aluminum, silver, and gold.

In the inspection apparatus 1 of the first embodiment of the present invention, the common electrode 4 may be provided with one electrode or a plurality of electrodes as illustrated in FIG. 1.

In the inspection apparatus 1, a common electrode terminal 6 is provided in an end portion of the substrate 2, and the common electrode 4 is connected to the common electrode terminal 6 by a connection wiring 7. As illustrated in FIG. 1, in a case where a plurality of common electrodes 4 is provided, the plurality of common electrodes 4 is electrically connected to one another by the connection wiring 7. Furthermore, the plurality of common electrodes 4 is connected to the common electrode terminal 6 by the connection wiring 7.

The inspection apparatus 1 of the first embodiment of the present invention may be configured without the common electrode terminal 6. In this case, when there is one common electrode 4, an end portion of the common electrode 4 may be exposed from the surface of the substrate so as to be used as the common electrode terminal. Further, when there is a plurality of common electrodes 4, the plurality of common electrodes 4 is electrically connected to one another by the connection wiring 7, and an end portion of at least one of the common electrodes 4 may be exposed from the surface of the substrate so as to be used as the common electrode terminal.

Further, in the inspection apparatus 1 of the first embodiment of the present invention, it is desirable that the common electrode 4 is provided in the substrate 2 to extend in a direction perpendicular to the surface of the substrate 2 of the wiring substrate 101 side. In a case where a plurality of common electrodes 4 is provided, it is desirable that each of the common electrodes 4 is provided in the substrate 2 to extend in a direction perpendicular to the surface of the substrate 2 of the wiring substrate 101 side.

In the inspection apparatus 1 of the first embodiment of the present invention, the electric capacitance electrode 3 and the common electrode 4 have mutually parallel portions. In a case where both the electric capacitance electrode 3 and the common electrode 4 have a rod shape or a line shape, the parallel of the electric capacitance electrode 3 and the common electrode 4 means that the respective extending directions thereof are in a parallel state. Further, in a case where both the electric capacitance electrode 3 and the common electrode 4 have a plate shape, that the electric capacitance electrode 3 and the common electrode 4 have the parallel portions means that the electric capacitance electrode 3 and the common electrode 4 have regions facing each other to be mutually parallel. The above definition is the same in other embodiments to be described below. The electric capacitance electrode 3 and the common electrode 4 are disposed in the substrate 2 to be spaced apart through the constituent material of the substrate 2 and are electrically insulated from each other.

For example, as illustrated in FIG. 1, as a preferred embodiment, in a case where each of the electric capacitance electrode 3 and the common electrode 4 is provided to extend in a direction perpendicular to the surface of the substrate 2 of the wiring substrate 101 side, the electric capacitance electrode 3 and the common electrode 4 are disposed to be parallel to each other.

The inspection apparatus 1 of the first embodiment of the present invention, which has the above configuration, is combined with the wiring substrate 101 being the inspection object and is used to measure the electric capacitance. Thus, the inspection apparatus 1 can perform the inspection of the wiring substrate 101, such as the test of the disconnection of the wiring 103 of the wiring substrate 101.

Next, an inspection method for inspecting a wiring substrate, which is performed using the inspection apparatus 1 of the first embodiment of the present invention, will be described.

The inspection method of the present embodiment includes a connecting operation of electrically connecting the wiring substrate 101 being the inspection object to the inspection apparatus 1.

Figure 2:
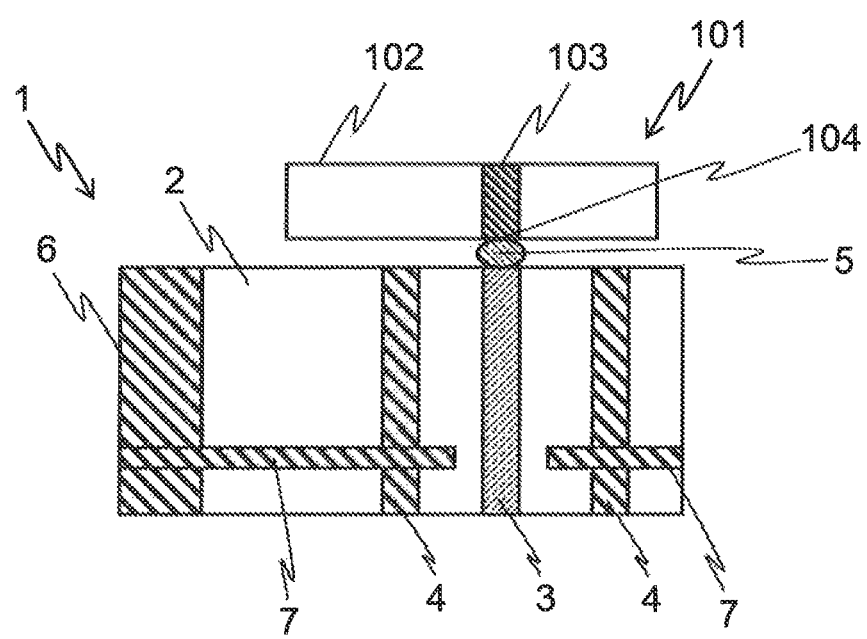
FIG. 2 shows a connecting operation of the inspection method using the inspection apparatus according to the first embodiment of the present invention.

FIG. 2 shows a connecting operation of the inspection method using the inspection apparatus according to the first embodiment of the present invention.

As illustrated in FIG. 2, in the connecting operation of the inspection method of the present embodiment, for example, at least one of the wiring substrate 101 being the inspection object and the inspection apparatus 1 is moved. Immediately below the terminal 104 of the wiring 103 passing through the base body 102 of the wiring substrate 101, the position determination is performed between the wiring substrate 101 and the inspection apparatus 1, such that the electrode pad 5 in the connection portion of the electric capacitance electrode 3 of the inspection apparatus 1 is disposed to face each other.

Subsequently, the wiring substrate 101 is moved to the inspection apparatus 1 side as it is, and is placed on the inspection apparatus 1. If necessary, the wiring substrate 101 is pressed against the inspection apparatus 1 side. As a result, the terminal 104 of the wiring 103 passing through the base body 102 of the wiring substrate 101 is brought into contact with the electrode pad 5 configuring the connection portion of the electric capacitance electrode 3 of the inspection apparatus 1 and are electrically connected to each other.

The inspection method of the present embodiment includes an electric capacitance measuring operation of measuring an electric capacitance between an end of a side opposite to the inspection apparatus 1, which is the other end of the wiring 103 of the wiring substrate 101, and the common electrode 4.

Figure 3:
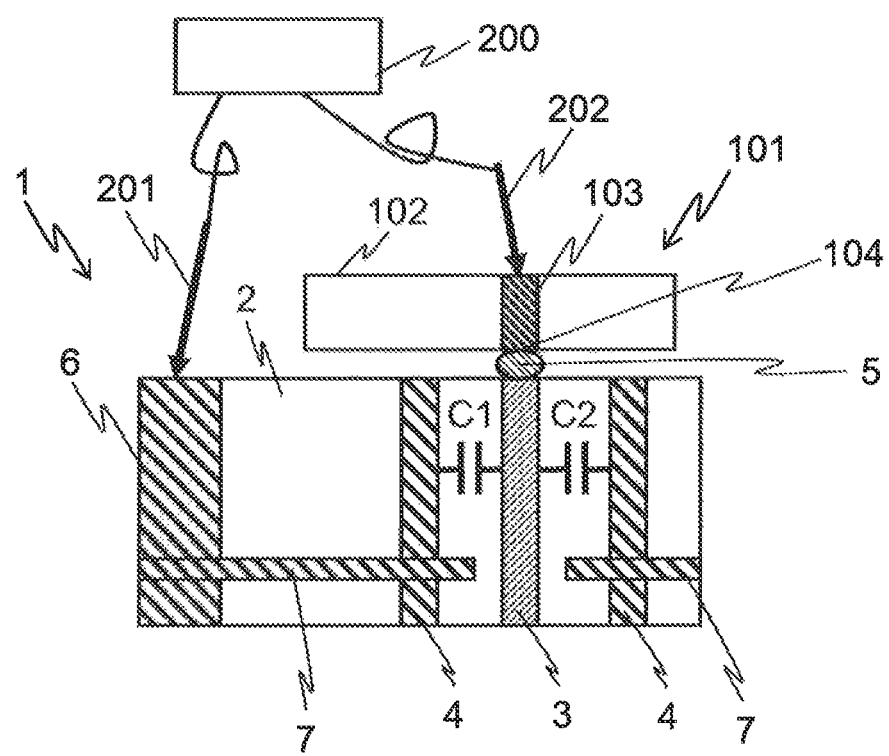
FIG. 3 shows an electric capacitance measuring operation of the inspection method using the inspection apparatus according to the first embodiment of the present invention.

FIG. 3 shows an electric capacitance measuring operation of the inspection method using the inspection apparatus according to the first embodiment of the present invention.

In the inspection method of the present embodiment, an electric capacitance meter 200 with two probes 201 and 202 is used. The probe 201 of one side is brought into contact with the common electrode terminal 6 of the inspection apparatus 1, and the probe 202 of the other side is brought into contact with the end of the side opposite to the inspection apparatus 1, which is the other end of the wiring 103 of the wiring substrate 101. At this time, the common electrode terminal 6 is electrically connected to the common electrode 4 by the connection wiring 7. Further, the wiring 103 of the wiring substrate 101 is connected to the electric capacitance electrode 3 through the electrode pad 5 in the connection portion.

Therefore, the electric capacitance meter 200 can measure the electric capacitance between the electric capacitance electrode 3 of the inspection apparatus 1 and the common electrode 4. Further, as illustrated in FIG. 2, in a case where a plurality of common electrodes 4 is provided, with the electric capacitance electrodes 3 being disposed therebetween, the electric capacitance meter 200 can measure a combined capacitance of electric capacitances C1, C2 and the like between the electric capacitance electrode 3 and each of the plurality of common electrodes 4.

In the inspection apparatus 1, the substrate 2 is set to a desired thickness. The areas and the distance of the portions facing each other between the electric capacitance electrode 3 and the common electrode 4 can be set to desired values. Therefore, as described above, the electric capacitance between the electric capacitance electrode 3 and the common electrode 4, which is measured by the electric capacitance meter 200, may be larger than the electric capacitance of the wiring 103 of the wiring substrate 101. That is, the apparent electric capacitance can be increased. As a result, the measurement of the electric capacitance by the electric capacitance meter 200 can be facilitated.

For example, in a case where the wiring 103 of the wiring substrate 101 is disconnected, the electric capacitance between the electric capacitance electrode 3 and the common electrode 4 cannot be measured by the electric capacitance meter 200. In this case, the electric capacitance measured by the electric capacitance meter 200 is different according to the existence or non-existence of the disconnection of the wiring 103, and the difference becomes very large. As a result, the inspection method of the present embodiment can easily and rapidly determine that the disconnection failure occurs in the wiring 103.

As described above, in the inspection method using the inspection apparatus 1 of the first embodiment of the present invention, the inspection apparatus 1 is combined with the wiring substrate 101 being the inspection object and is used for the measurement of the electric capacitance. As a result, since the existence or non-existence of the disconnection of the wiring 103 of the wiring substrate 101 is measured, the wiring substrate 101 can be inspected. That is, even in a case where the base body 102 of wiring substrate 101 being the inspection object is thin and the electric capacitance of the wiring 103 passing through the wiring substrate 101 is small, the inspection method of the present embodiment can easily and rapidly determine the existence or non-existence of the disconnection of the wiring by measuring the electric capacitance and inspect the wiring substrate 101.

Embodiment 2

Figure 4:
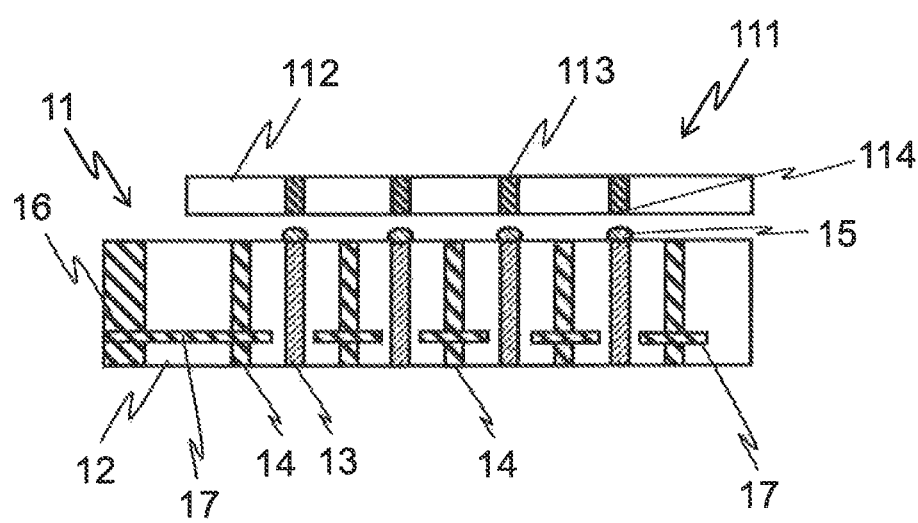
FIG. 4 shows a configuration of an inspection apparatus according to the second embodiment of the present invention.

FIG. 4 shows a configuration of an inspection apparatus according to the second embodiment of the present invention.

As illustrated in FIG. 4, an inspection apparatus 11 of a second embodiment of the present invention is an inspection apparatus that is combined with a wiring substrate 111 being an inspection object and is used to inspect the wiring substrates 111. The wiring substrate 111 includes a base body 112 and a plurality of wiring 113 passing through the base body 112. The wiring 103 of the wiring substrate 101 are disposed in the base body 112 to be spaced apart from one another and are mutually independent. In each of the plurality of wiring 113, an end portion of the inspection apparatus 1 side being an end portion of one side configures a terminal 114.

The wiring substrate 111 may include the base body 112 such as, for example, a silicon substrate, and the plurality of wiring 113 passing through the base body 112, or may be a semiconductor chip or semiconductor substrate with a plurality of TSV.

The inspection apparatus 11 of the second embodiment of the present invention includes a substrate 12, a plurality of electric capacitance electrode 13 being a first electrode, and a plurality of common electrode 14 being a second electrode.

The substrate 12 is an electrically insulating substrate made of an insulating material. As a material configuring the substrate 12, a material configuring a base substrate of a well-known printed wiring substrate may be used, and a resin such as polyimide or a material such as a ceramic may be used. The substrate 12 need not be rigid and may be configured using a flexible insulating material such as a rubber.

Each of the plurality of electric capacitance electrodes 13 is provided in the substrate 12. End portions of the plurality of electric capacitance electrodes 13 are exposed from a surface of the substrate 12 on which the wiring substrate 111 is disposed, and configure electrical connection portions, respectively. That is, as illustrated in FIG. 4, in the inspection apparatus 11, an electrode pad 15 is individually provided in an end portion of the plurality of electric capacitance electrode 13 which are exposed from the surface of the substrate 12, and the electrical connection portion of each electric capacitance electrode 13 is configured.

The inspection apparatus 11 of the second embodiment of the present invention may be configured without the electrode pad 15, and may configure the electrical connection portion without the electrode pad 15 by protruding each end portion of the plurality of electric capacitance electrode 13 from the surface of the substrate.

The electric capacitance electrode 13 is made of a conductive material and has a rod shape, but may also have a line shape or a plate shape. The electric capacitance electrode 13 may be made of, for example, a metal such as copper, aluminum, silver, and gold.

The plurality of electric capacitance electrodes 13 are arranged such that each of the ends of the plurality of wiring 113 of the wiring substrate 111 forms a pair with the connection portion of one electric capacitance electrode 13 among the plurality of electric capacitance electrodes 13. That is, in a case where the wiring substrate 111 is disposed to face the inspection apparatus 11 so as to inspect the wiring substrate 111, the plurality of electric capacitance electrodes 13 is arranged such that each of the ends of the plurality of wiring 113 of the wiring substrate 111 face the connection portion of one electric capacitance electrode 13 among the plurality of electric capacitance electrodes 13. The plurality of electric capacitance electrodes 13 is provided in the substrate 12 such that the electric capacitance electrodes 13 are electrically insulated from one another.

In the inspection apparatus 11 of the second embodiment of the present invention, it is desirable that the plurality of electric capacitance electrodes 13 are individually provided in the substrate 12 to extend in a direction perpendicular to the surface of the substrate 12 of the wiring substrate 111 side in which the connection portion is configured.

Further, the common electrode 14 is provided in the substrate 12. The common electrode 14 is made of a conductive material and has a rod shape, but may also have a line shape or a plate shape. Similar to the electric capacitance electrode 13, the common electrode 14 may be made of, for example, a metal such as copper, aluminum, silver, and gold.

In the inspection apparatus 11 of the second embodiment of the present invention, the plurality of common electrode 14 may be provided with a plurality of electrodes as illustrated in FIG. 4. As illustrated in FIG. 4, the plurality of common electrodes 14 of the inspection apparatus 11 has an arrangement structure corresponding to the arrangement of the number of the electric capacitance electrodes 13. It is desirable that the plurality of common electrodes 14 is arranged to include a structure in which at least one pair of the common electrodes 14 holds the single electric capacitance electrode 13. Since the common electrodes 14 have such an arrangement structure, it is possible to efficiently increase the apparent electric capacitance in a case where the inspection apparatus 11 and the wiring substrate 111 are combined. The inspection of the wiring substrate 111 can be performed easily and rapidly by measuring the electric capacitance.

Figure 5:
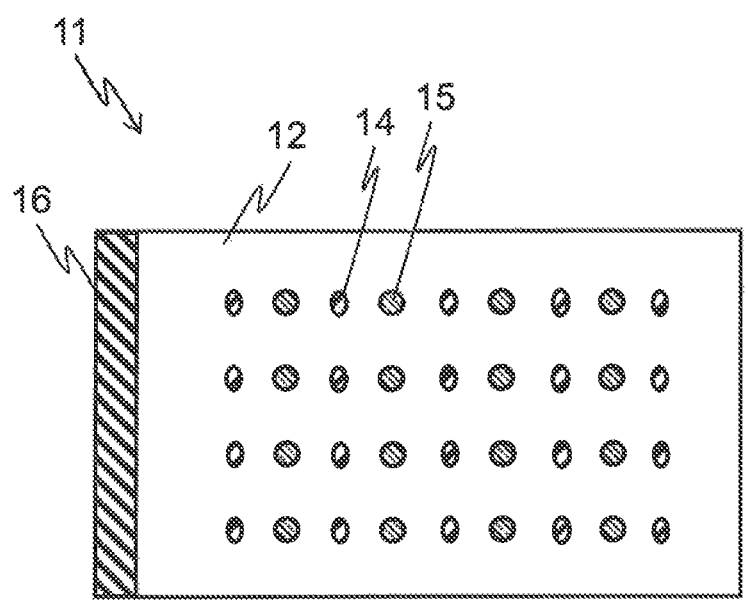
FIG. 5 is a plane view schematically showing the inspection apparatus according to the second embodiment of the present invention.

An example of a more specific arrangement structure of the electric capacitance electrodes 13 and the common electrodes 14 of the inspection apparatus 11 is illustrated in FIG. 5.

FIG. 5 is a plane view schematically showing the inspection apparatus according to the second embodiment of the present invention.

That is, as illustrated in FIG. 4 described above, the inspection apparatus 11 includes the plurality of electric capacitance electrodes 13 and the electrode pads 15 thereof in the substrate 12 in correspondence to the arrangement of the wiring 113 of the wiring substrate 111.

For example, the inspection apparatus 11 may have an arrangement structure illustrated in FIG. 5 as the arrangement structure of the electric capacitance electrodes 13 and the electrode pads 15 corresponding to the arrangement of the wiring 113 of the wiring substrate 111. Specifically, the inspection apparatus 11 has an arrangement structure of the electric capacitance electrodes, in which the plurality of electric capacitance electrodes (not illustrated) and the plurality of electrode pads 15 are disposed in the substrate 12 to be spaced apart from one another by a predetermined interval in a predetermined direction, that is, a horizontal direction of FIG. 5, and a plurality of rows each including the electric capacitance electrodes and the electrode pads 15 is disposed to be spaced apart from one another by a predetermined interval in a vertical direction of FIG. 5.

In the inspection apparatus 11, one common electrode 14 is disposed in the substrate 12 between both ends of the row of the electric capacitance electrodes and two electric capacitance electrodes adjacent to each other in the row. Therefore, in the inspection apparatus 11, a plurality of electrode rows each having a structure in which the common electrodes 14 are disposed on both ends and the common electrodes 14 and the electric capacitance electrodes 13 are alternately disposed in the horizontal direction of FIG. 5 is disposed in the substrate 12 in the vertical direction of FIG. 5.

The arrangement structure of the electric capacitance electrodes 13 and the common electrodes 14, which is illustrated in FIG. 5, also includes a structure in which one pair of common electrodes 14 holds one electrode capacitance electrode 13. Since the common electrodes 14 have such an arrangement structure, it is possible to efficiently increase the apparent electric capacitance in a case where the inspection apparatus 11 and the wiring substrate 111 are combined. The inspection of the wiring substrate 111 can be performed easily and rapidly by measuring the electric capacitance.

As shown in FIG. 4, in the inspection apparatus 11, a common electrode terminal 16 is provided in an end portion of the substrate 12, and the common electrode 14 is connected to the common electrode terminal 16 by a connection wiring 17. As illustrated in FIG. 4, in a case where a plurality of common electrodes 14 is provided, the plurality of common electrodes 14 is electrically connected to one another by the connection wiring 17. Furthermore, the plurality of common electrodes 14 is connected to the common electrode terminal 16 by the connection wiring 17.

The inspection apparatus 11 of the second embodiment of the present invention may be configured without the common electrode terminal 16. In this case, when there is a plurality of common electrodes 14, the plurality of common electrodes 14 is electrically connected to one another by the connection wiring 17, an end portion of at least one of the common electrodes 14 may be exposed from the surface of the substrate so as to be used as the common electrode terminal.

Further, in the inspection apparatus 11 of the second embodiment of the present invention, it is desirable that each of the plurality of common electrodes 14 is provided in the substrate 12 to extend in a direction perpendicular to the surface of the substrate 12 of the wiring substrate 111 side.

In the inspection apparatus 11 of the second embodiment of the present invention, the electric capacitance electrode 13 and the common electrode 14 have mutually parallel portions. That is, each of the plurality of electric capacitance electrodes 13 is configured to have a portion parallel to the nearest common electrode 14. The electric capacitance electrode 13 and the common electrode 14 are disposed in the substrate 12 to be spaced apart through the constituent material of the substrate 12 and are electrically insulated from each other.

For example, as illustrated in FIG. 4, as a preferred embodiment, in a case where each of the electric capacitance electrode 13 and the common electrode 14 is provided to extend in a direction perpendicular to the surface of the substrate 12 of the wiring substrate 111 side, the electric capacitance electrode 13 and the common electrode 14 are disposed to be parallel to each other. At this time, it is obvious that each of the plurality of electric capacitance electrodes 13 is configured to be parallel to the nearest common electrode 14.

The inspection apparatus 11 of the second embodiment of the present invention, which has the above configuration, is combined with the wiring substrate 111 being the inspection object and is used to measure the electric capacitance. Thus, the inspection apparatus 1 can perform the inspection of the wiring substrate 111, such as the test of the disconnection of the wiring 113 of the wiring substrate 111.

Next, an inspection method for inspecting a wiring substrate, which is performed using the inspection apparatus 11 of the second embodiment of the present invention, will be described.

The inspection method of the present embodiment includes a connecting operation of electrically connecting the wiring substrate 111 being the inspection object to the inspection apparatus 11.

Figure 6:
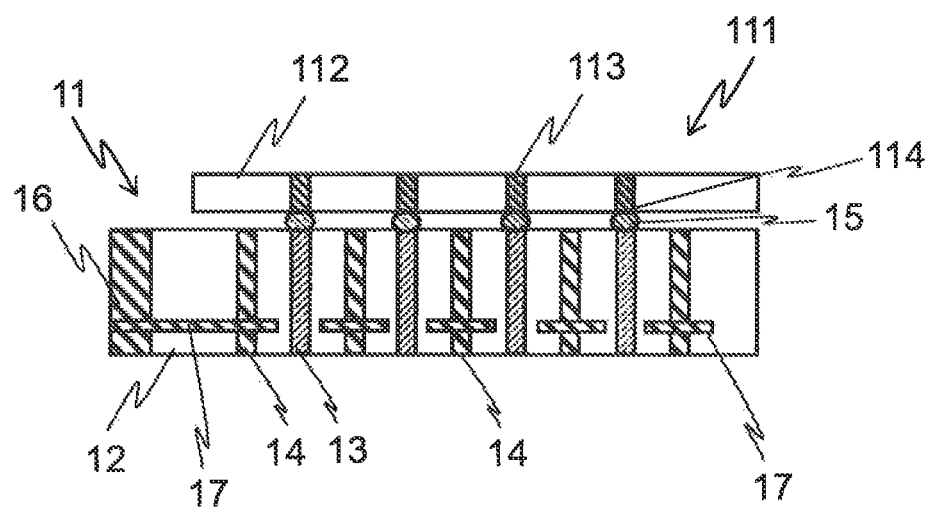
FIG. 6 shows a connecting operation of the inspection method using the inspection apparatus according to the second embodiment of the present invention.

FIG. 6 shows a connecting operation of the inspection method using the inspection apparatus according to the second embodiment of the present invention.

As illustrated in FIG. 6, in the connecting operation of the inspection method of the present embodiment, for example, at least one of the wiring substrate 111 being the inspection body and the inspection apparatus 11 is moved. As described above, the wiring substrate 111 includes a plurality of wiring 113 passing through the base body 112. One end of each of the plurality of wiring 113 on the inspection apparatus 11 side configures a terminal 114. Further, in the inspection apparatus 11, respective electrode pads 15 are provided in end portions of the plurality of electric capacitance electrodes 13 which are exposed from the surface of the substrate 12, and electrical connection portions of the respective electric capacitance electrodes 13 are configured.

Therefore, the wiring substrate 111 and the inspection apparatus 11 are positioned such that each of the terminals 114 of the plurality of wiring 113 faces one of the plurality of electrode pads 15 to form a pair. That is, immediately below each of the terminals 114 of the plurality of wiring 113, the wiring substrate 111 and the inspection apparatus 11 are positioned such that one electrode pad 15 of the electric capacitance electrodes 13 is disposed to faces each other.

Subsequently, the wiring substrate 111 is moved to the inspection apparatus 11 side as it is, and is placed on the inspection apparatus 11. If necessary, the wiring substrate 111 is pressed against the inspection apparatus 11 side. As a result, each of the terminals 114 of the plurality of wiring 113 passing through the base body 112 of the wiring substrate 111 is brought into contact with the electrode pad 15 configuring the connection portion of the electric capacitance electrode 13 of the inspection apparatus 11, such that the terminal 114 and the electrode pad 15 are electrically connected.

The inspection method of the present embodiment includes an electric capacitance measuring operation of measuring an electric capacitance between an end of a side opposite to the inspection apparatus 11, which is the other end of the wiring 113 of the wiring substrate 111, and the common electrode 14.

Figure 7:
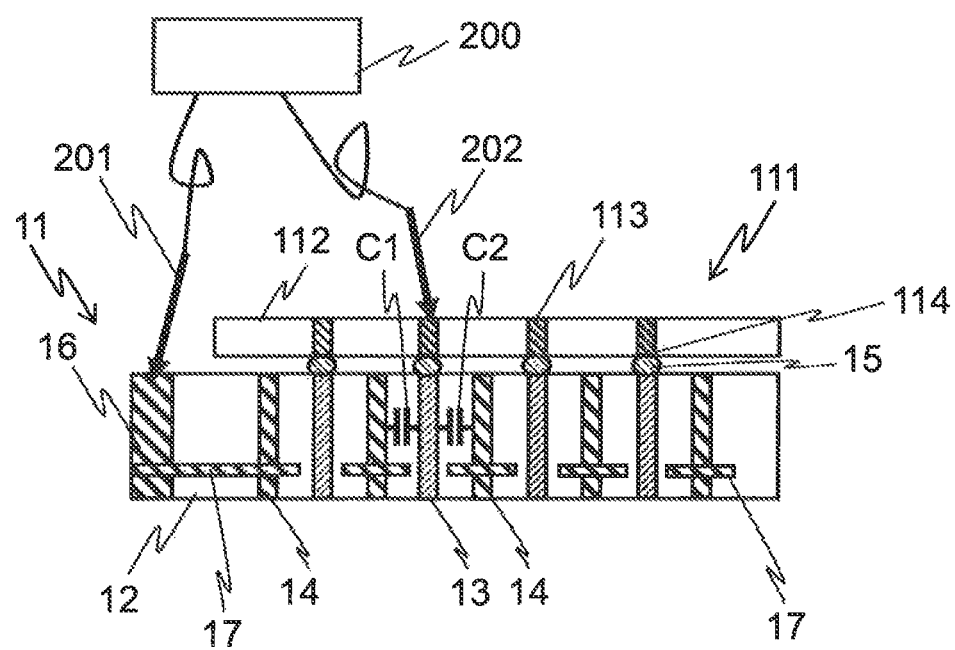
FIG. 7 shows an electric capacitance measuring operation of the inspection method using the inspection apparatus according to the second embodiment of the present invention.

FIG. 7 shows an electric capacitance measuring operation of the inspection method using the inspection apparatus according to the second embodiment of the present invention.

In the inspection method of the present embodiment, an electric capacitance meter 200 with two probes 201 and 202 is used. The electric capacitance meter 200 is similar to that used in the electric capacitance measuring operation of the inspection method using the inspection apparatus 1 of the first embodiment of the present invention as illustrated in FIG. 3. As shown in FIG. 7, the probe 201 of one side is brought into contact with the common electrode terminal 16 of the inspection apparatus 11, and the probe 202 of the other side is brought into contact with the end of the side opposite to the inspection apparatus 11, which is the other end of the wiring 113 of the wiring substrate 111. At this time, the common electrode terminal 16 is electrically connected to the common electrode 14 by the connection wiring 17.

Further, the wiring 113 of the wiring substrate 111 is connected to the electric capacitance electrode 13 through the electrode pad 15 in the connection portion.

Therefore, the electric capacitance meter 200 can measure the electric capacitance between the electric capacitance electrode 13 and the common electrode 14. As illustrated in FIG. 7, the common electrode 14 is provided to have a structure in which one pair of common electrodes 14 holds one electrode capacitance electrode 13. Therefore the electric capacitance meter 200 can measure a combined capacitance of electric capacitances C1, C2 between the electric capacitance electrode 13 and each of a pair of common electrodes 14.

In the inspection apparatus 11, the substrate 12 is set to a desired thickness. The areas and the distance of the portions facing each other between the electric capacitance electrode 13 and the common electrode 14 can be set to desired values. Therefore, as described above, the electric capacitance between the electric capacitance electrode 13 and the common electrode 14, which is measured by the electric capacitance meter 200, may be larger than the electric capacitance of the wiring 113 of the wiring substrate 111. That is, the apparent electric capacitance can be increased. As a result, the measurement of the electric capacitance by the electric capacitance meter 200 can be facilitated.

For example, in a case where the wiring 113 of the wiring substrate 111 is disconnected, the electric capacitance between the electric capacitance electrode 13 and the common electrode 14 cannot be measured by the electric capacitance meter 200. In this case, the electric capacitance measured by the electric capacitance meter 200 is different according to the existence or non-existence of the disconnection of the wiring 113, and the difference becomes very large. As a result, the inspection method of the present embodiment can easily and rapidly determine that the disconnection failure occurs in the wiring 113.

Further, in a case where one probe 202 of the electric capacitance meter 200 is brought into contact with the end of the wiring 113, the plurality of wiring 113 of the wiring substrate 111 is sequentially selected one by one, and the probe 202 is brought into contact with the other end of the selected single wiring 113. Subsequently, electric capacitances between the end of the wiring 113 contacting the probe 202 and the plurality of common electrodes 14 electrically connected to one another are sequentially measured. In this manner, all the plurality of wiring 113 of the wiring substrate 111 can be sequentially inspected.

Further, in the electric capacitance meter 200, a plurality of probes 202 brought into contact with the ends of the wiring 113 can be provided. In this case, each of the plurality of probes 202 is brought into contact with the other end of one wiring 113 among the plurality of wrings 113. The plurality of wiring 113 having the terminals contacting the probes 202 is selected one by one, and the electric capacitance meter 200 is operated such that electric capacitances between the end of the wiring 113 contacting the probe 202 and the plurality of common electrodes 14 electrically connected to one another are sequentially measured. In this manner, all the plurality of wiring 113 of the wiring substrate 111 can be sequentially inspected.

As described above, in the inspection method using the inspection apparatus 11 of the second embodiment of the present invention, the inspection apparatus 11 is combined with the wiring substrate 111 being the inspection object and is used for the measurement of the electric capacitance. As a result, since the existence or non-existence of the disconnection of the wiring 113 of the wiring substrate 111 is determined, the wiring substrate 111 can be inspected. That is, even in a case where the base body 112 of wiring substrate 111 being the inspection object is thin and the electric capacitance of each wiring 113 passing through the wiring substrate 111 is small, the inspection method of the present embodiment can easily and rapidly determine the existence or non-existence of the disconnection of each wiring 113 by measuring the electric capacitance and inspect the wiring substrate 111.

Embodiment 3

Figure 8:
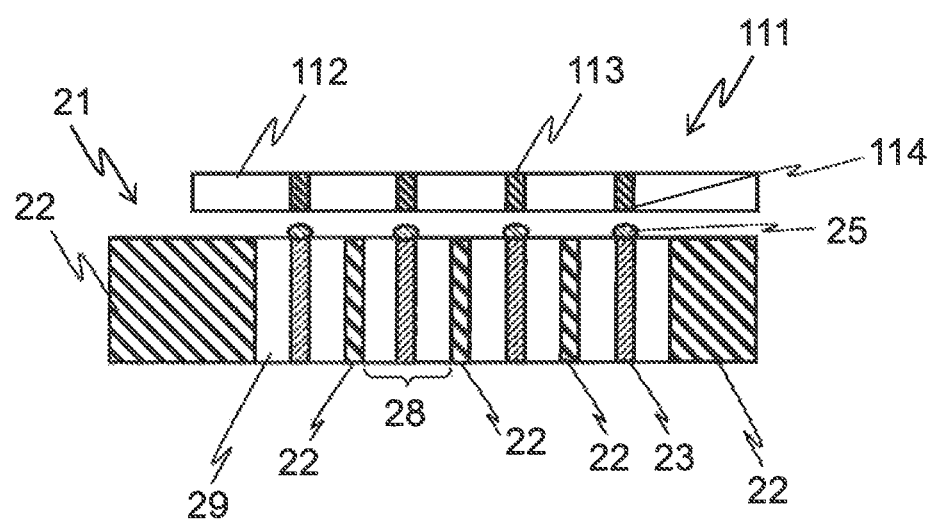
FIG. 8 shows a configuration of an inspection apparatus according to the third embodiment of the present invention.

FIG. 8 shows a configuration of an inspection apparatus according to the third embodiment of the present invention.

As illustrated in FIG. 8, an inspection apparatus 21 of a third embodiment of the present invention is an inspection apparatus that is combined with a wiring substrate 111 being an inspection object and is used to inspect the wiring substrates 111. The wiring substrate 111 is similar to the wiring substrate 111 which is inspected using the inspection apparatus 11 of the second embodiment of the present invention, as illustrated in FIG. 4 and the like. Therefore, the same constituent elements are denoted by the same reference numerals, and a redundant description thereof will be omitted.

The inspection apparatus 21 of the third embodiment of the present invention includes a substrate 22, a recessed portion 28 provided in the substrate 22, an insulating member 29 that covers a wall surface of the recessed portion 28, and an electrode 23 inserted into the recessed portion 28.

The substrate 22 is an electrically conductive substrate made of a conductive material. A material configuring the substrate 22 may be a metal material, such as copper, aluminum, iron, silver, and gold.

The recessed portion 28 has a hole shape provided from the surface of the substrate 22 on the wiring substrate 111 side (upper surface of FIG. 8). A desirable shape of the recessed portion 28 may be a cylindrical shape extending from the surface of the substrate 22 in a thickness direction thereof. In this case, the recessed portion 28 has a rectangular cross section and a circular longitudinal section. The recessed portion 28 may have a cylindrical shape of which a longitudinal section is elliptical, or a cylindrical shape of which a longitudinal section is square or rectangular. As illustrated in FIG. 8, in the inspection apparatus 21, the recessed portion 28 may be formed as a through-hole passing through the substrate 22.

Further, as described above, the inspection apparatus 21 includes the insulating member 29 that covers the wall surface of the recessed portion 28. A material configuring the insulating member 29 may be a resin material, such as a polyimide-based resin material, an acryl-base resin material, and an epoxy resin material. It is desirable that the insulating member 29 covers the wall surface of the recessed portion 28 without gaps.

As described above, the inspection apparatus 21 includes the electrode 23 inserted into the recessed portion 28. The electrode 23 is provided inside the recessed portion 28 of the substrate 22, and an end of the electrode 23 being a part thereof is exposed from the surface of the substrate 22 of the side where the wiring substrate 111 is disposed, and configures an electrical connection portion. That is, as illustrated in FIG. 8, in the inspection apparatus 21, an electrode pad 25 is provided in an end portion of the electrode 23 exposed from the surface of the substrate 22, and the electrical connection portion of the electrode 23 is configured. The inspection apparatus 21 of the third embodiment of the present invention may be configured without the electrode pad 25. Furthermore, the electrical connection portion may be configured by protruding the end portion of the electrode 23 from the surface of the substrate, without providing the electrode pad 25.

The electric capacitance electrode 23 is made of a conductive material and has a rod shape, but may also have a line shape or a plate shape. The electric capacitance electrode 23 may be made of, for example, a metal such as copper, aluminum, silver, and gold.

The electrode 23 is inserted into the recessed portion 28 such that the surrounding is covered by the insulating member 29. In this case, it is desirable that the portion of the electrode 23 inserted into the recessed portion 28 is covered without gaps by the insulating member 29. Therefore, the insulating member 29 is disposed between the wall surface of the recessed portion 28 and the electrode 23 inserted into the recessed portion 28, and is provided to cover the surrounding of the electrode 23 while covering the wall surface of the recessed portion 28.

In the inspection apparatus 21 of the third embodiment of the present invention, it is desirable that the electrode 23 is provided inside a recessed portion 28 provided in the substrate 22 to extend in a direction perpendicular to the surface of the substrate 22 of the wiring substrate 111 side in which the connection portion is configured.

Regarding the recessed portion 28, the insulating member 29, and the electrode 23 of the inspection apparatus 21 having the above configuration, the recessed portion 28 may be formed by processing the prepared substrate 22, the insulating member 29 may be formed by covering the wall surface of the recessed portion 28 using an appropriate resin composition or the like, and then, the electrode 23 may be inserted.

In the inspection apparatus 21 of the third embodiment of the present invention, the wall of the recessed portion 28 and the electrode 23 have mutually parallel portions. That is, each of the recessed portion 28 and the electrode 23 includes a portion in which a forming direction of the recessed portion 28 and an extending direction of the electrode 23 are parallel to each other and a portion in which the wall surface and the extending direction of the electrode 23 are parallel to each other. The wall surface of the recessed portion 28 of the substrate 22 and the electrode 23 inserted into the recessed portion 28 are spaced apart from each other by the insulating member 29 and are electrically insulated from each other.

In this case, in the wall surface of the recessed portion 28 and the electrode 23, it is desirable that a distance between the mutually parallel portions is smaller than a distance between the other portions. Due to such a configuration, as described below, in a case where the inspection apparatus 21 and the wiring substrate 111 are combined and the measured apparent electric capacitance is increased, the magnitude can be easily controlled to be a desired value.

As a preferred embodiment, for example, in the case of the configuration illustrated in FIG. 8, the wall surface of the recessed portion 28 and the electrode 23 are in a mutually parallel state. That is, in a case where the recessed portion 28 of the substrate 22 has a cylindrical shape extending from the surface of the substrate 22 in a thickness direction thereof and the electrode 23 is provided to extend with a rod shape in a direction perpendicular to the surface of the substrate 22, the wall surface of the recessed portion 28 and the electrode 23 are in a mutually parallel state.

Further, in the inspection apparatus 21 of the third embodiment of the present invention, a plurality of electrodes 23 is provided such that each of the ends of the plurality of wiring 113 of the wiring substrate 111 forms a pair with one connection portion of the electrodes 23. Therefore, a plurality of recessed portions 28 into which the electrodes 23 are inserted is provided corresponding to the arrangement of the electrodes 23.

That is, in a case where the wiring substrate 111 is disposed to face the inspection apparatus 21 so as to inspect the wiring substrate 111, the plurality of electrodes 23 and the plurality of recessed portions 28 are arranged such that each of the ends of the plurality of wiring 113 of the wiring substrate 111 face the connection portion of one electrode 23 among the plurality of electrodes 23. As described above, the plurality of electrodes 23 is disposed to be electrically insulated from one another by covering the surrounding with the insulating member 29 within the recessed portion 28 of the substrate 22.

In a case where the electrodes 23 are arranged in the above configuration in the electrically conductive substrate 22 and thus the inspection apparatus 21 and the wiring substrate 111 are combined, the apparent electric capacitance can be efficiently increased. The inspection of the wiring substrate 111 can be performed easily and rapidly by measuring the electric capacitance.

Figure 9:
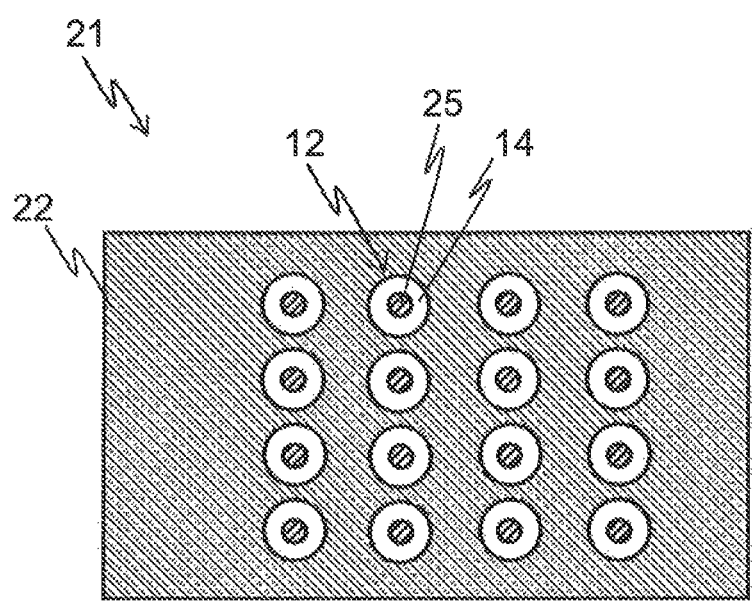
FIG. 9 is a schematic plane view of the inspection apparatus according to the third embodiment of the present invention.

An example of a more specific arrangement structure of the recessed portion 28 and the electrode 23 in the substrate 22 of the inspection apparatus 21 is illustrated in FIG. 9.

FIG. 9 is a schematic plane view of the inspection apparatus according to the third embodiment of the present invention.

That is, as illustrated in FIG. 8, described above, the inspection apparatus 21 includes the plurality of electrodes 23 and the electrode pads 25 thereof, and the plurality of recessed portions 28 in the substrate 22 in correspondence to the arrangement of the wiring 113 of the wiring substrate 111. For example, the inspection apparatus 21 may have an arrangement structure illustrated in FIG. 9 as the arrangement structure of the electrodes 23, the electrode pads 25, and the recessed portions 28, corresponding to the arrangement of the wiring 113 of the wiring substrate 111.

Specifically, in the inspection apparatus 21, the plurality of recessed portions 28 is disposed in the substrate 22 to be spaced apart from one another by a predetermined distance in a predetermined direction, that is, a horizontal direction of FIG. 9, the electrodes (not illustrated) are disposed in each of the plurality of recessed portions 28, and the electrode pads 25 are disposed. Thus, the row of the recessed portions 28 into which the electrodes are inserted may be formed. The inspection apparatus 21 may have an arrangement structure in which a plurality of rows of the recessed portions 28 into which the electrodes are inserted is disposed to be spaced apart from one another by a predetermined interval in a vertical direction of FIG. 9.

In this case, the arrangement structure of the recessed portions 28 is configured such that, when the electrodes are inserted into the recessed portions 28, the electrodes and the electrode pads 25 correspond to the arrangement of the wiring 113 of the wiring substrate 111. Further, in the inside of the recessed portions 28, the electrodes are disposed to be insulated from the substrate 22 by covering the surrounding with the insulating member 29.

That is, in the arrangement structure of the electrodes, the electrode pads 25, and the recessed portions 28, which is illustrated in FIG. 9, the surrounding of one electrode 23 is enclosed by the electrically insulating substrate 22, with the insulating member 29 being disposed therebetween. It is possible to efficiently increase the apparent electric capacitance in a case where the inspection apparatus 21 and the wiring substrate 111 are combined. The inspection of the wiring substrate 111 using, as one example, a disconnection test of the wiring 113 of the wiring substrate 111 can be performed easily and rapidly by measuring the electric capacitance.

Next, an inspection method for inspecting a wiring substrate, which is performed using the inspection apparatus 21 of the third embodiment of the present invention, will be described.

The inspection method of the present embodiment includes a connecting operation of electrically connecting the wiring substrate 111 being the inspection object to the inspection apparatus 21.

Figure 10:
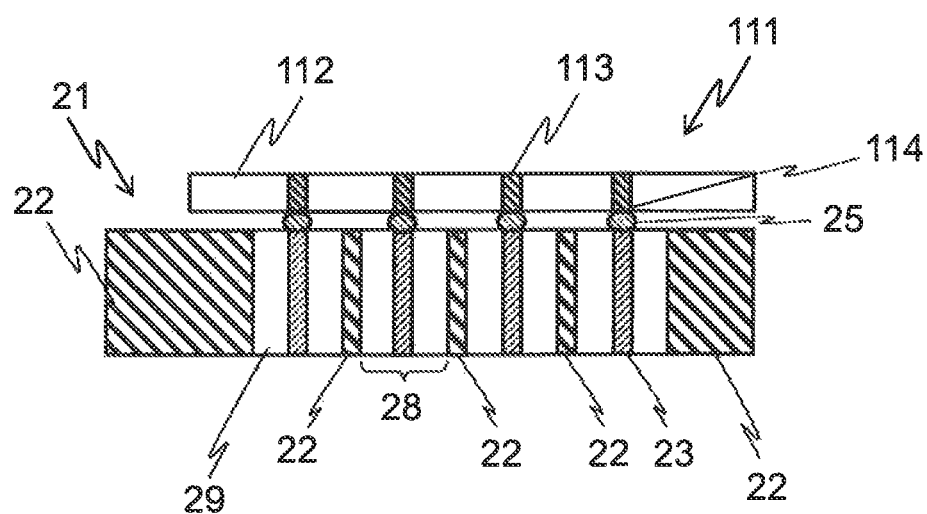
FIG. 10 shows a connecting operation of the inspection method using the inspection apparatus according to the third embodiment of the present invention.

FIG. 10 shows a connecting operation of the inspection method using the inspection apparatus according to the third embodiment of the present invention.

As illustrated in FIG. 10, in the connecting operation of the inspection method of the present embodiment, for example, at least one of the wiring substrate 111 being the inspection body and the inspection apparatus 21 is moved. As described above, the wiring substrate 111 includes a plurality of wiring 113 passing through the base body 112. One end of each of the plurality of wiring 113 on the inspection apparatus 21 side configures a terminal 114. Further, in the inspection apparatus 11, respective electrode pads 25 are provided in end portions of the plurality of electrodes 23 which are exposed from the surface of the substrate 12, and electrical connection portions of the respective electrodes 23 are configured.

Therefore, the wiring substrate 111 and the inspection apparatus 21 are positioned such that each of the terminals 114 of the plurality of wiring 113 faces one of the plurality of electrode pads 25 to form a pair. That is, immediately below each of the terminals 114 of the plurality of wiring 113, the wiring substrate 111 and the inspection apparatus 21 are positioned such that one electrode pad 25 of the electrodes 23 is disposed to faces each other.

Subsequently, the wiring substrate 111 is moved to the inspection apparatus 21 side as it is, and is placed on the inspection apparatus 21. If necessary, the wiring substrate 111 is pressed against the inspection apparatus 21 side. As a result, each of the terminals 114 of the plurality of wiring 113 passing through the base body 112 of the wiring substrate 111 is brought into contact with the electrode pad 25 configuring the connection portion of the electrode 23 of the inspection apparatus 21, such that the terminal 114 and the electrode pad 15 are electrically connected.

The inspection method of the present embodiment includes an electric capacitance measuring operation of measuring an electric capacitance between an end of a side opposite to the inspection apparatus 21, which is the other end of the wiring 103 of the wiring substrate 111, and the substrate 22.

Figure 11:
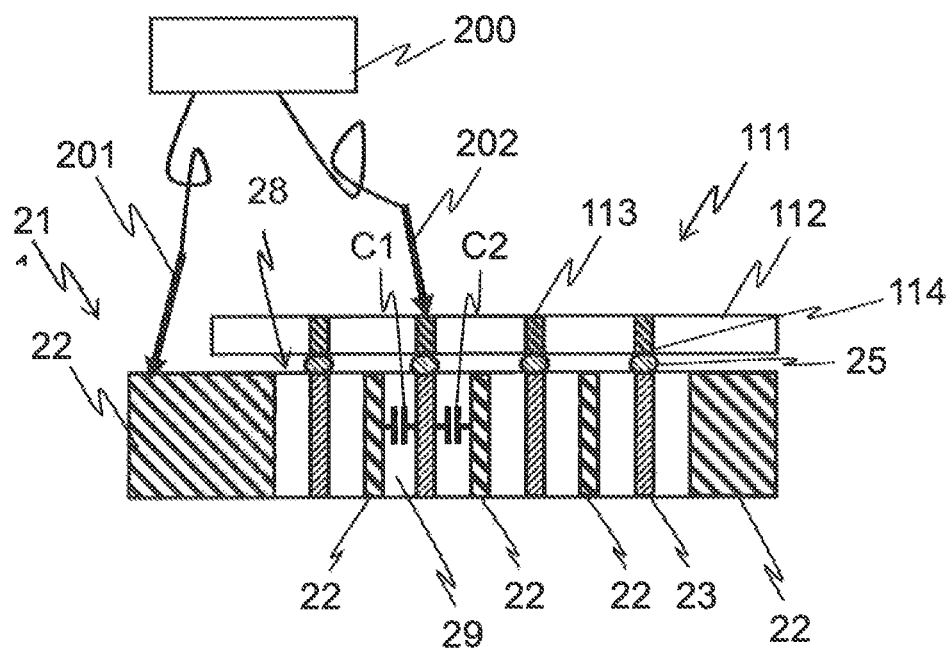
FIG. 11 shows an electric capacitance measuring operation of the inspection method using the inspection apparatus according to the third embodiment of the present invention.

FIG. 11 shows an electric capacitance measuring operation of the inspection method using the inspection apparatus according to the third embodiment of the present invention.

In the inspection method of the present embodiment, an electric capacitance meter 200 with two probes 201 and 202 is used. The electric capacitance meter 200 is similar to that used in the electric capacitance measuring operation of the inspection method using the inspection apparatus 1 of the first embodiment of the present invention as illustrated in FIG. 3. As shown in FIG. 11, the probe 201 of one side is brought into contact with the substrate 22 of the inspection apparatus 21, and the probe 202 of the other side is brought into contact with the end of the side opposite to the inspection apparatus 21, which is the other end of the wiring 113 of the wiring substrate 111. The substrate 22 of the inspection apparatus 21 is an electrical conductive substrate, which is made of a conductive material. Further, the wiring 113 of the wiring substrate 111 is connected to the electrode 23 through the electrode pad 25 in the connection portion.

Therefore, the electric capacitance meter 200 can measure the electric capacitance between the electrode 23 of the inspection apparatus 21 and the substrate 22. As illustrated in FIG. 11, the surrounding of the electrode 23 is covered by the insulating member 29 within the recessed portion 28 of the substrate 22 and is disposed to be insulated from the substrate 22. Therefore, the electric capacitance meter 200 can measure a combined capacitance of electric capacitances C1, C2 and the like, for example, between the electrodes 23 and the wall surfaces of the recessed portions 28 of the substrate 22.

In the inspection apparatus 21, the substrate 22 is set to a desired thickness. The areas and the distance of the portions facing each other between the recessed portions 28 and the electrode 23 can be set to desired values. Therefore, as described above, the electric capacitance between the electrode 23 and the wall of the recessed portion 28, which is measured by the electric capacitance meter 200, may be larger than the electric capacitance of the wiring 113 of the wiring substrate 111. That is, the apparent electric capacitance can be increased. As a result, the measurement of the electric capacitance by the electric capacitance meter 200 can be facilitated.

For example, in a case where the wiring 113 of the wiring substrate 111 is disconnected, the electric capacitance between the electrode 23 and the wall of the recessed portions 28 cannot be measured by the electric capacitance meter 200. In this case, the electric capacitance measured by the electric capacitance meter 200 is different according to the existence or non-existence of the disconnection of the wiring 113, and the difference becomes very large. As a result, the inspection method of the present embodiment can easily and rapidly determine that the disconnection failure occurs in the wiring 113.

Further, in a case where one probe 202 of the electric capacitance meter 200 is brought into contact with the end of the wiring 113, the plurality of wiring 113 of the wiring substrate 111 is sequentially selected one by one, and the probe 202 is brought into contact with the other end of the selected single wiring 113. Subsequently, electric capacitances between the end of the wiring 113 contacting the probe 202 and the substrate 22 are sequentially measured. In this manner, all the plurality of wiring 113 of the wiring substrate 111 can be sequentially inspected.

Further, in the electric capacitance meter 200, a plurality of probes 202 brought into contact with the ends of the wiring 113 can be provided. In this case, each of the plurality of probes 202 is brought into contact with the other end of one wiring 113 among the plurality of wrings 113. The plurality of wiring 113 having the terminals contacting the probes 202 is selected one by one, and the electric capacitance meter 200 is operated such that electric capacitances between the end of the wiring 113 contacting the probe 202 and the substrate 22 are sequentially measured. In this manner, all the plurality of wiring 113 of the wiring substrate 111 can be sequentially inspected.

As described above, in the inspection method using the inspection apparatus 21 of the third embodiment of the present invention, the inspection apparatus 21 is combined with the wiring substrate 111 being the inspection object and is used for the measurement of the electric capacitance. As a result, since the existence or non-existence of the disconnection of the wiring 113 of the wiring substrate 111 is determined, the wiring substrate 111 can be inspected. That is, even in a case where the base body 112 of wiring substrate 111 being the inspection object is thin and each electric capacitance of the plurality of wiring 113 passing through the wiring substrate 111 is small, the inspection method of the present embodiment can easily and rapidly determine the existence or non-existence of the disconnection of each wiring 113 by measuring the electric capacitance and inspect the wiring substrate 111.

The present invention is not limited to the embodiments described above and can be implemented in various ways without departing from the spirit of the present invention.

For example, in the second embodiment of the present invention, the inspection apparatus 11 including the plurality of electric capacitance electrodes 13 and the plurality of common electrodes 14 is provided as an example. However, in the second embodiment of the present invention, the arrangement structure of the common electrodes is not limited to those illustrated in FIGS. 4 and 5.

In the second embodiment of the present invention, more common electrodes than those illustrated in FIG. 5 and the like may be provided.

For example, two common electrodes 14 may be disposed between the electric capacitance electrodes adjacent in the horizontal direction of FIG. 5 and the electrode pads 15. The distance between the electric capacitance electrode and the common electrode adjacent thereto may be further reduced.

Further, in the second embodiment of the present invention, one or more common electrodes 14 may be disposed between the electric capacitance electrodes and the electrode pads 15 adjacent in the vertical direction of FIG. 5.

Furthermore, in the second embodiment of the present invention, the common electrodes may be disposed around the electric capacitance electrodes and the electrode pads 15, except for the positions in the horizontal direction and the vertical direction of FIG. 5. For example, the common electrodes may be disposed at positions and the like in a diagonal direction of the electric capacitance electrodes and the electrode pads 15 thereof.

In the second embodiment of the present invention, as another example of what is illustrated in FIG. 5 and the like, since the common electrodes are disposed to have the above structure, the existence or non-existence of the disconnection of each wiring 113 can be determined easily and rapidly by measuring the electric capacitance and the wiring substrate 111 can be inspected, even in a case where the base body 112 of the wiring substrate 111 being the inspection object is thin and the electric capacitance of each of the plurality of wiring 113 passing through the wiring substrate 111 is small.

What is claimed is:

1. An inspection apparatus for inspecting wiring of an inspection object by measuring electrical capacitance, wherein the inspection object includes a base body having opposed first and second surfaces, and wiring contained within and passing through the base body, from the first surface of the base body to the second surface of the base body, and exposed at the second surface of the base body, wherein the wiring of the inspection object has an electrical capacitance and the inspection apparatus comprises:
   an electrically insulating substrate having opposed first and second surfaces, a first electrode located in the electrically insulating substrate and extending perpendicular to the first and second surfaces of the electrically insulating substrate and exposed at or protruding from the first surface of the electrically insulating substrate for making an electrical connection to the wiring of the inspection object, at the second surface of the base body, when the inspection object and the inspection apparatus are moved close to each other,
   a second electrode contained within the electrically insulating substrate, spaced from the first electrode, electrically insulated from the first electrode, and extending between the first and second surfaces of the electrically insulating substrate, wherein the
   first electrode and the second electrode are mutually parallel, and
   when the first electrode is electrically connected to the wiring of the inspection object, electrical capacitance between the first and second electrodes is larger than the electrical capacitance of the wiring of the inspection object, so that the electrical capacitance of the wiring of the inspection object increases when the first electrode is electrically connected to the wiring of the inspection object,
   a common electrode accessible from outside the electrically insulating substrate,
   connection wiring within the electrically insulating substrate and electrically connecting the second electrode to the common electrode, wherein the inspection object is movable independently of and with respect to the inspection apparatus so that the wiring of the inspection object is electrically connected to the first electrode of the inspection apparatus when the inspection object is moved close to the inspection apparatus, and is electrically disconnected when the inspection object is moved apart from the inspection apparatus, and
   an electrical capacitance measuring device making electrical contacts to the common electrode and to the wiring of the inspection object at the first surface of the base body, with the wiring of the inspection object electrically connected to the first electrode at the second surface of the base body.

2. The inspection apparatus according to claim 1, wherein the inspection object includes a plurality of the wirings contained within and passing through the base body, from the first surface of the base body to the second surface of the base body, and exposed at the second surface of the base body, wherein the wirings are mutually electrically insulated from each other, and the inspection apparatus includes:
   a plurality of the first electrodes located in the electrically insulating substrate and extending between the first and second surfaces of the electrically insulating substrate, perpendicular to the first and second surfaces of the electrically insulating substrate, and exposed at or protruding from the first surface of the electrically insulating substrate, wherein the first electrodes are mutually electrically insulated from each other, and are arranged in the electrically insulating substrate to make electrical connections to respective wirings of the inspection object when the inspection object is moved close to the inspection apparatus; and
   a plurality of the second electrodes that are electrically insulated from the first electrodes and that are electrically connected to one another by the connection wiring, wherein each of the first electrodes is parallel to the second electrode that is nearest to the respective first electrode.

3. The inspection apparatus according to claim 2, wherein each of the first electrodes is disposed between a pair of the second electrodes.

4. An inspection apparatus for inspecting wiring of an inspection object by measuring electrical capacitance, wherein the inspection object includes a base body having opposed first and second surfaces, and
wiring contained within and passing through the base body, from the first surface to the second surface of the base body, and exposed at the second surface of the base body, the wiring of the inspection object has an electrical capacitance, and the inspection apparatus comprises:
an electrically conducting substrate having opposed first and second surfaces and including a recess extending through the electrically conducting substrate from the first surface to the second surface, wherein the recess includes a wall surface of the electrically conducting substrate, an electrode located in the recess in the electrically conducting substrate, extending perpendicular to the first and second surfaces of the electrically conducting substrate, and exposed at or protruding from the first surface of the electrically conducting substrate for making an electrical connection to the wiring of the inspection object, at the second surface of the base body, when the inspection object is moved close to the inspection apparatus, and
an electrically insulating member located within the recess, covering the wall surface of the recess, and electrically insulating the electrode from the electrically conducting substrate, wherein
the wall surface of the recess and the electrode have mutually parallel portions,
the inspection object is movable independently of and with respect to the inspection apparatus so that the wiring of the inspection object is electrically connected to the electrode of the inspection apparatus when the inspection object is moved close to the inspection apparatus, and is electrically disconnected when the inspection object is moved apart from the inspection apparatus, and
when the electrode is electrically connected to the wiring of the inspection object, electrical capacitance between the electrode and the wall surface is larger than the electrical capacitance of the wiring of the inspection object, so that the electrical capacitance of the wiring of the inspection object increases when the electrode is electrically connected to the wiring of the inspection object, and
an electrical capacitance measuring device making electrical contacts to the electrically conducting substrate and to the wiring of the inspection object at the first surface of the base body, with the wiring of the inspection object electrically connected to the electrode at the second surface of the base body.

5. The inspection apparatus according to claim 4, wherein the inspection object includes a plurality of the wirings contained within and passing through the base body, from the first surface of the base body to the second surface of the base body, and exposed at the second surface of the base body, and the inspection apparatus includes a plurality of the recesses in the electrically conducting substrate, a plurality of the insulating members, and
a plurality of the electrodes, wherein one of the insulating members and one of the electrodes is disposed in each respective recess, the electrodes are exposed at or protrude from the first surface of the electrically conducting substrate, the electrodes are perpendicular to the first and second surfaces of the electrically conducting substrate, and the electrodes are arranged in the electrically conductive substrate to make an electrical connection to respective wirings of the inspection object when the inspection object is moved close to the inspection apparatus.

6. A method of inspecting wirings of an inspection object by measuring electrical capacitance, using an inspection apparatus, wherein
the inspection object includes a base body having opposed first and second surfaces, a plurality of wirings contained within and passing through the base body, from the first surface to the second surface of the base body, and exposed at the second surface of the base body, wherein the wirings of the inspection object have respective electrical capacitances; and
the inspection apparatus includes
an electrically insulating substrate having opposed first and second surfaces,
a plurality of first electrodes located in the electrically insulating substrate, extending perpendicular to the first and second surfaces of the electrically insulating substrate, exposed at or protruding from the first surface of the electrically insulating substrate for making respective electrical connections to the wirings of the base body, at the second surface of the base body, when the inspection object and the inspection apparatus are moved close to each other,
a plurality of second electrodes contained within the electrically insulating substrate, spaced from the first electrodes, electrically insulated from the first electrodes, and extending between the first and second surfaces of the electrically insulating substrate, wherein
the first electrodes and the second electrodes are parallel, and
when a first electrode is electrically connected to a respective wiring of the inspection object, electrical capacitance between the first and second electrodes is larger than the electrical capacitance of the respective wiring of the inspection object, so that the electrical capacitance of the respective wiring of the inspection object increases when the respective first electrode is electrically connected to the respective wiring of the inspection object, and
a common electrode accessible from outside the electrically insulating substrate, and connection wiring within the electrically insulating substrate and electrically connecting the second electrodes to the common electrode, wherein the inspection object is movable independently of and with respect to the inspection apparatus so that the wirings of the inspection object can be electrically connected to the first electrodes of the inspection apparatus when the inspection object is moved close to the inspection apparatus, and are electrically disconnected when the inspection object is moved apart from the inspection apparatus, and
the method comprises:
moving the inspection object close to the inspection apparatus and electrically connecting each of the wirings of the inspection object at the second surface of the base body to a respective one of the first electrodes of the inspection apparatus at the first surface of the electrically insulating substrate; and
sequentially selecting the wirings of the inspection object, one-by-one, and measuring electrical capacitance between (i) each wiring and the first electrode electrically connected to the respective wiring and (ii) the second electrodes through the common electrode and the connection wiring.

7. A method of inspecting wirings of an inspection object by measuring electrical capacitance, using an inspection apparatus, wherein the inspection object includes a base body having opposed first and second surfaces, a plurality of wirings contained within the base body and passing through the base body, from the first surface to the second surface of the base body, and exposed at the second surface of the base body, wherein the wirings of the inspection object have respective electrical capacitances; and the inspection apparatus includes an electrically conducting substrate having opposed first and second surfaces and including a plurality of recesses extending through the electrically conducting substrate from the first surface to the second surface, wherein the recesses include respective wall surfaces of the electrically conducting substrate, a plurality of electrodes, wherein a respective electrode is located in each of the recesses in the electrically conducting substrate, extending perpendicular to the first and second surfaces of the electrically conducting substrate, exposed at or protruding from the first surface of the electrically conducting substrate for making respective electrical connections to corresponding wirings of the inspection object, at the second surface of the base body, when the inspection object is moved close to the inspection apparatus, and a plurality of electrically insulating members, wherein a respective electrically insulating member is located in each of the recesses, covering the wall surface of the respective recess, and electrically insulating the electrode in the respective recess from the electrically conducting substrate, the wall surfaces of the recesses and the electrodes are parallel, and the inspection object is movable independently of and with respect to the inspection apparatus so that the wirings of the inspection object can be electrically connected to respective electrodes of the inspection apparatus when the inspection object is close to the inspection apparatus, and are electrically disconnected when the inspection object is moved apart from the inspection apparatus, wherein, when a respective electrode is electrically connected to a respective wiring of the inspection object, electrical capacitance between the respective electrode and the wall surface is larger than the electrical capacitance of the respective wiring of the inspection object, so that the electrical capacitance of the respective wiring of the inspection object increases when the electrode is electrically connected to the wiring of the inspection object, and the method comprises:

moving the inspection object close to the inspection apparatus and electrically connecting each of the wirings of the inspection object to a respective electrode of the inspection apparatus; and sequentially selecting the wirings of the inspection object, one-by-one, and measuring electrical capacitance between (i) each wiring and the electrode electrically connected to the respective wiring and (ii) the electrically conducting substrate.

* * * * *